United States Patent
Tada et al.

(10) Patent No.: US 12,292,172 B2
(45) Date of Patent: May 6, 2025

(54) ON-VEHICLE ILLUMINATION DEVICE AND PRODUCTION METHOD THEREFOR

(71) Applicant: Stanley Electric Co., Ltd., Tokyo (JP)

(72) Inventors: Reiki Tada, Tokyo (JP); Akihiko Hanya, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 18/570,538

(22) PCT Filed: Jun. 2, 2022

(86) PCT No.: PCT/JP2022/022513
§ 371 (c)(1),
(2) Date: Dec. 14, 2023

(87) PCT Pub. No.: WO2022/264830
PCT Pub. Date: Dec. 22, 2022

(65) Prior Publication Data
US 2024/0288138 A1    Aug. 29, 2024

(30) Foreign Application Priority Data
Jun. 18, 2021    (JP) .................................. 2021-101834

(51) Int. Cl.
*F21S 41/20* (2018.01)
*F21S 4/24* (2016.01)
(Continued)

(52) U.S. Cl.
CPC ............... *F21S 41/285* (2018.01); *F21S 4/24* (2016.01); *F21S 41/143* (2018.01); *F21V 31/04* (2013.01);
(Continued)

(58) Field of Classification Search
CPC .... F21S 4/22; F21S 4/24; F21S 41/285; F21S 41/143; F21V 31/04; F21V 19/002;
(Continued)

(56) References Cited

U.S. PATENT DOCUMENTS

2004/0223327 A1* 11/2004 Kuan ...................... F21V 29/74
362/545
2013/0021811 A1*  1/2013 Goldwater ................ B62J 6/01
362/249.04
(Continued)

FOREIGN PATENT DOCUMENTS

CN     103486511 B  *  5/2018   ........... B60Q 1/0041
DE     102018131775 A1 *  6/2020
(Continued)

OTHER PUBLICATIONS

International Search Report for PCT/JP2022/022513 dated Jul. 19, 2022.

*Primary Examiner* — Erin Kryukova
(74) *Attorney, Agent, or Firm* — KENEALY VAIDYA LLP

(57) ABSTRACT

Provided is an on-vehicle illumination device which is compact, does not have a space therein, and is capable of realizing a complex curved surface shape. The on-vehicle illumination device includes a light-emitting element disposed on a wiring pattern on a substrate, and an outer lens layer made of a resin and mounted on the light-emitting element. The substrate has a shape curved along a curvature of the outer lens layer in a front-rear direction.

19 Claims, 11 Drawing Sheets

(51) Int. Cl.
 *F21S 41/143* (2018.01)
 *F21V 31/04* (2006.01)
 *F21Y 115/10* (2016.01)

(52) U.S. Cl.
 CPC ... *F21Y 2115/10* (2016.08); *H05K 2203/1131* (2013.01); *H05K 2203/1316* (2013.01)

(58) Field of Classification Search
 CPC ........ F21V 19/0025; H05K 2203/1131; H05K 2203/1316; F21Y 2115/10
 See application file for complete search history.

(56) References Cited

U.S. PATENT DOCUMENTS

| | | | |
|---|---|---|---|
| 2013/0265735 A1* | 10/2013 | Nakatani | H01L 24/83 |
| | | | 252/514 |
| 2017/0205065 A1* | 7/2017 | Zanotto | F21V 19/002 |
| 2017/0254518 A1* | 9/2017 | Vasylyev | F21V 9/08 |
| 2018/0259137 A1* | 9/2018 | Lee | F21S 10/02 |
| 2018/0374834 A1* | 12/2018 | Tada | H01L 33/60 |
| 2019/0097094 A1* | 3/2019 | Han | H01L 25/0753 |
| 2020/0386390 A1* | 12/2020 | Chen | F21S 4/24 |
| 2022/0018503 A1* | 1/2022 | Shen | F21S 41/26 |

FOREIGN PATENT DOCUMENTS

| | | |
|---|---|---|
| JP | 2013-243028 A | 12/2013 |
| JP | 6095931 B2 | 3/2017 |
| JP | 2018-142737 A | 9/2018 |
| JP | 2020-42917 A | 3/2020 |
| WO | 2013/132764 A1 | 9/2013 |

\* cited by examiner

FIG. 6
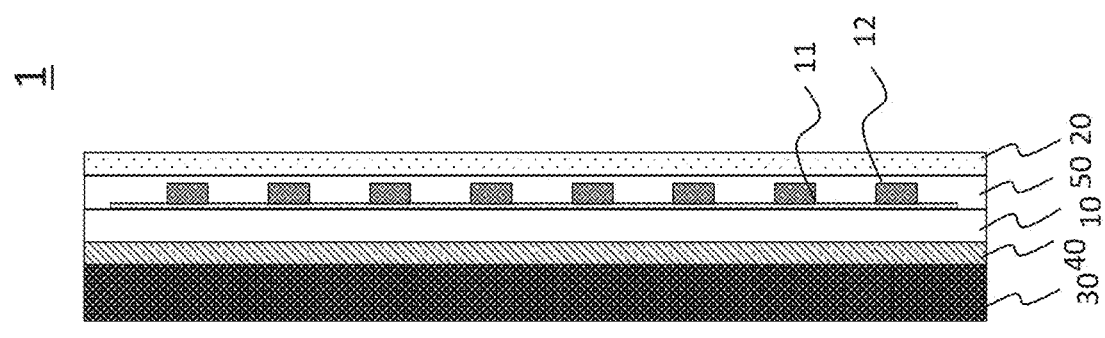
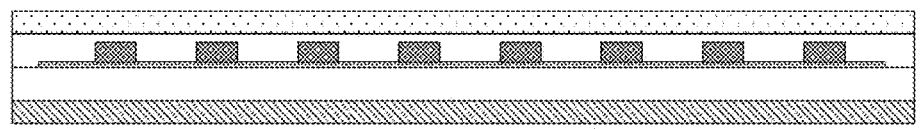

FIG. 7
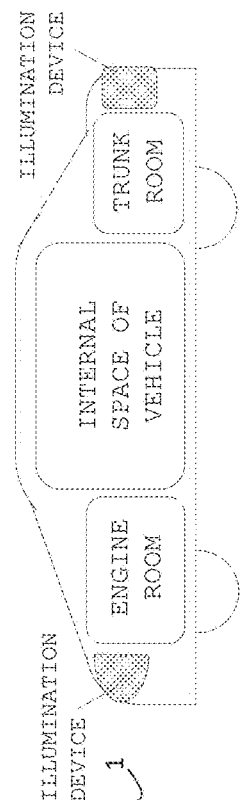
(a)
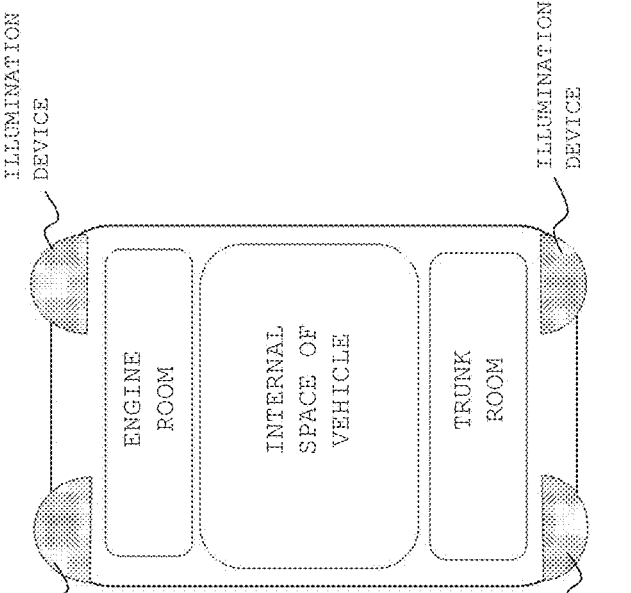
(c) COMPARATIVE EXAMPLE
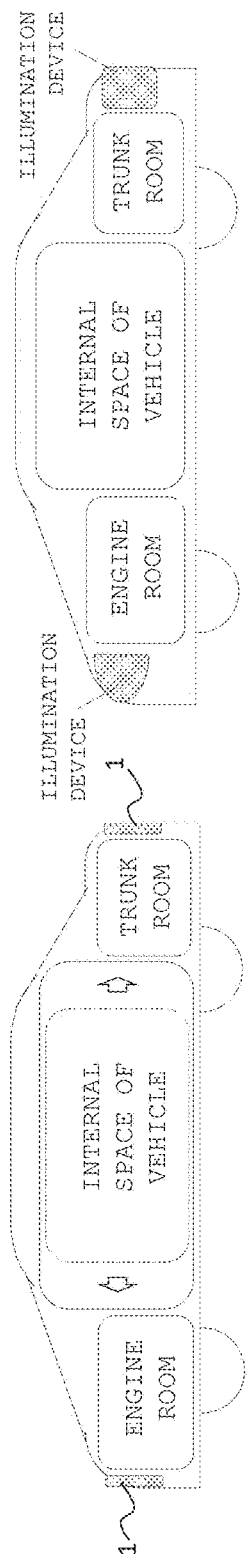
(b)
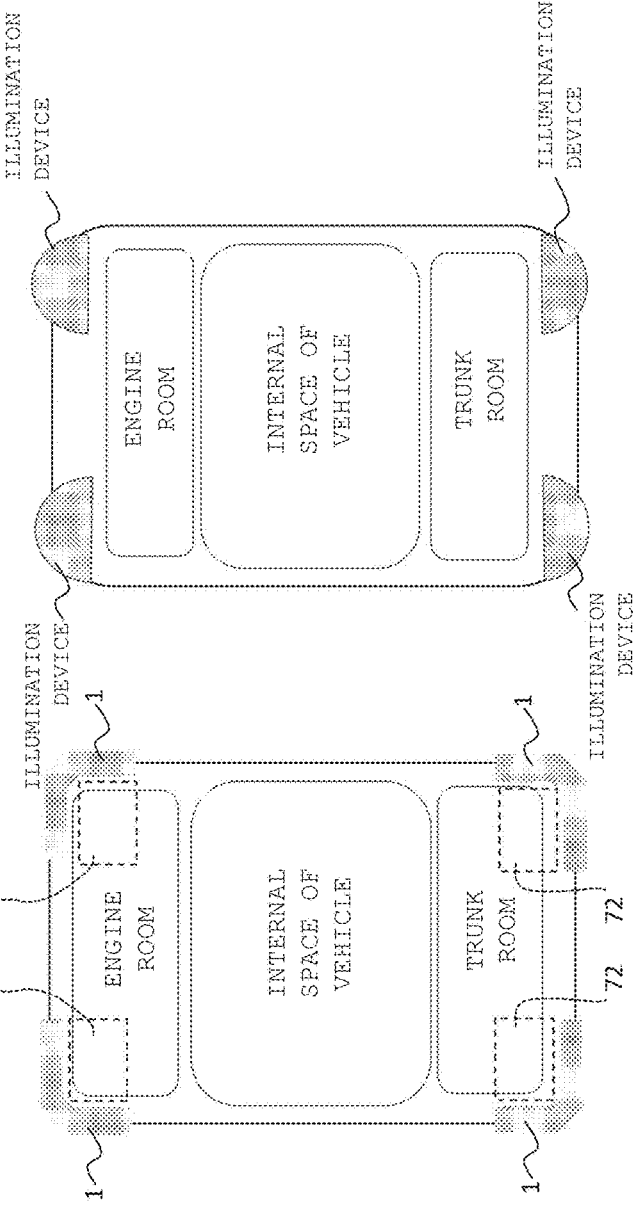
(d) COMPARATIVE EXAMPLE FIG. 10
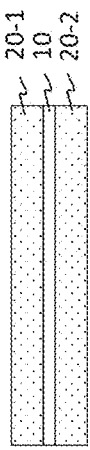
(b) THREE-DIMENSIONAL SHAPE
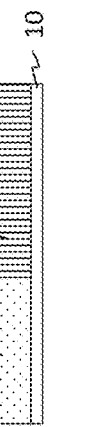
(e) BOTH SIDE MOLDING
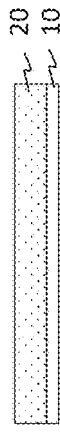
(a) TWO-DIMENSIONAL SHAPE
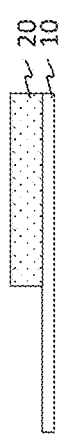
(d) PARTIAL MOLDING
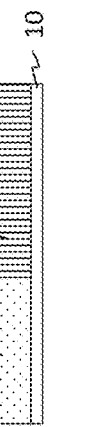
(h) DIFFERENT MATERIAL MOLDING
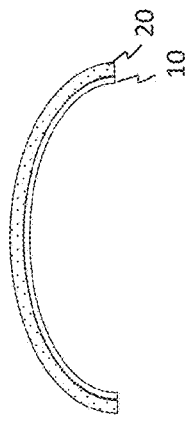
(c) TWO-COLOR MOLDING
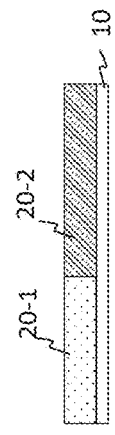
(g) PARTIAL DECORATION
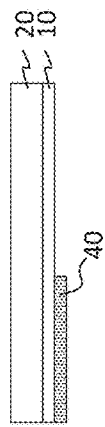
(f) REAR SURFACE DECORATION
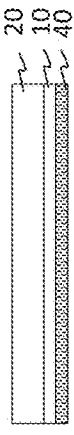
(j) FRONT AND REAR SURFACE DECORATION
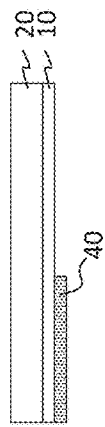
(i) FRONT SURFACE DECORATION

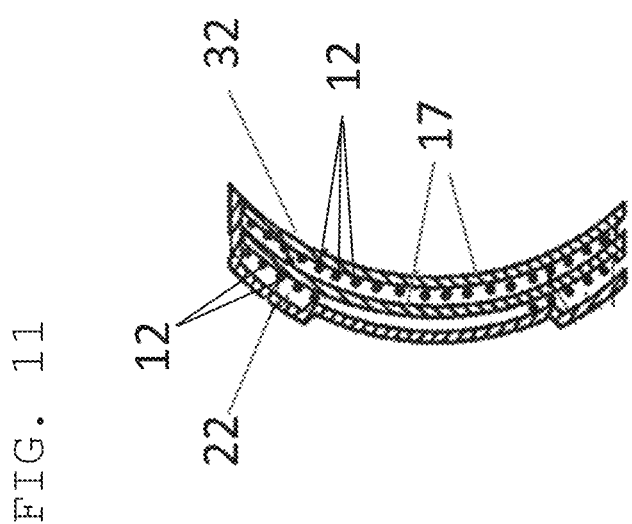

ON-VEHICLE ILLUMINATION DEVICE AND PRODUCTION METHOD THEREFOR

PRIORITY AND INCORPORATION BY REFERENCE

This application is a U.S. National Stage Application under 35 U.S.C § 371 of International Patent Application No. PCT/JP2022/022513 filed Jun. 2, 2022, which claims the benefit of priority under 35 U.S.C. § 119 to Japanese Patent Application No. 2021-101834, filed Jun. 18, 2021, the content of which are incorporated herein by reference.

TECHNICAL FIELD

The present invention relates to a thin and three-dimensionally molded on-vehicle illumination device.

BACKGROUND ART

An on-vehicle illumination device such as a headlight and a rear lamp is configured by, for example, as disclosed in Patent Literature 1, fixing a light source unit, a reflector, and a projection lens unit into an opening of a housing by screwing or the like, and closing the opening with a cover. Each unit is configured by a plurality of parts and mechanisms, which are also structured to be assembled together by screwing, fitting, soldering, or the like. Further, a fan is installed on a lamp housing to cool the light source unit by discharging air inside the lamp housing to the outside.

CITATION LIST

Patent Literature

PTL 1: JP6095931B

SUMMARY OF INVENTION

Technical Problem

As mentioned above, the on-vehicle illumination device in the related art has a structure in which many parts are assembled, and a space is required in the housing. Therefore, the thickness of the entire on-vehicle illumination device increases, and the volume occupied by the entire on-vehicle illumination device increases.

In recent years, an on-vehicle illumination device is required to have high design quality that matches the outer appearance of a vehicle and to provide comfort by expanding the internal space of the vehicle. Thus, a three-dimensional shape with a complex curved surface and a compact structure are desired.

An objective of the invention is to provide an on-vehicle illumination device which is compact and capable of realizing a complex curved surface shape.

Solution to Problem

In order to achieve the above objective, an on-vehicle illumination device according to the invention includes a substrate, a wiring pattern mounted on the substrate, a light-emitting element disposed on the wiring pattern, and an outer lens layer made of a resin and mounted on the light-emitting element. The substrate has a shape curved along a curvature of the outer lens layer in a front-rear direction.

Advantageous Effects of Invention

According to the invention, since a substrate has a shape curved along a curvature of an outer lens layer in a front-rear direction, it is possible to provide an on-vehicle illumination device which is compact and capable of realizing a complex curved surface shape.

BRIEF DESCRIPTION OF DRAWINGS

FIG. 6 is a cross-sectional view illustrating the production process of the on-vehicle illumination device according to the first embodiment.

FIGS. 7(a) and 7(b) are diagrams illustrating an internal space of a vehicle when the vehicle equipped with the on-vehicle illumination device according to the first embodiment is viewed from the side and the top, respectively, FIGS. 7(c) and 7(d) are diagrams illustrating an internal space of a vehicle when the vehicle equipped with an illumination device in the related art is viewed from the side and the top, respectively.

FIGS. 10(a) to 10(j) are cross-sectional views of an on-vehicle illumination device according to a first modification of the invention.

FIG. 11 is a cross-sectional view of the on-vehicle illumination device according to the second modification of the invention.

DESCRIPTION OF EMBODIMENTS

An on-vehicle illumination device according to an embodiment of the invention will be described below with reference to the drawings.

In the related art, an on-vehicle illumination device is configured by a plurality of parts, and thus, a space is required therein to assemble the parts. However, the inventors provide an on-vehicle illumination device capable of reducing the number of parts by eliminating an internal space.

In order to eliminate the internal space, integral molding using a resin, for example, insert molding, is effective. However, in general, a heating temperature of the resin required during insert molding is higher than a melting point of a solder such as a low melting point solder, a eutectic solder, and a lead-free solder. Therefore, during insert molding, the solder is remelted by heat of a molten resin, and a light-emitting element mounted on a substrate falls off.

Therefore, the inventors use fine metal particles as a bonding material for the light-emitting element, and make insert molding possible by using a melting point drop of the fine metal particles. As a result, at the time of bonding, by using the melting point drop of the fine metal particles and by using the fact that the fine metal particles have a low melting point, the fine metal particles are melted at a low temperature to form a bulk, thereby achieving bonding. During insert molding, the bulk bonding material has a high melting point, and thus, the bonding material is not remelted even by the heat of the molten resin. Therefore, insert molding becomes possible.

First Embodiment

Figure 2:
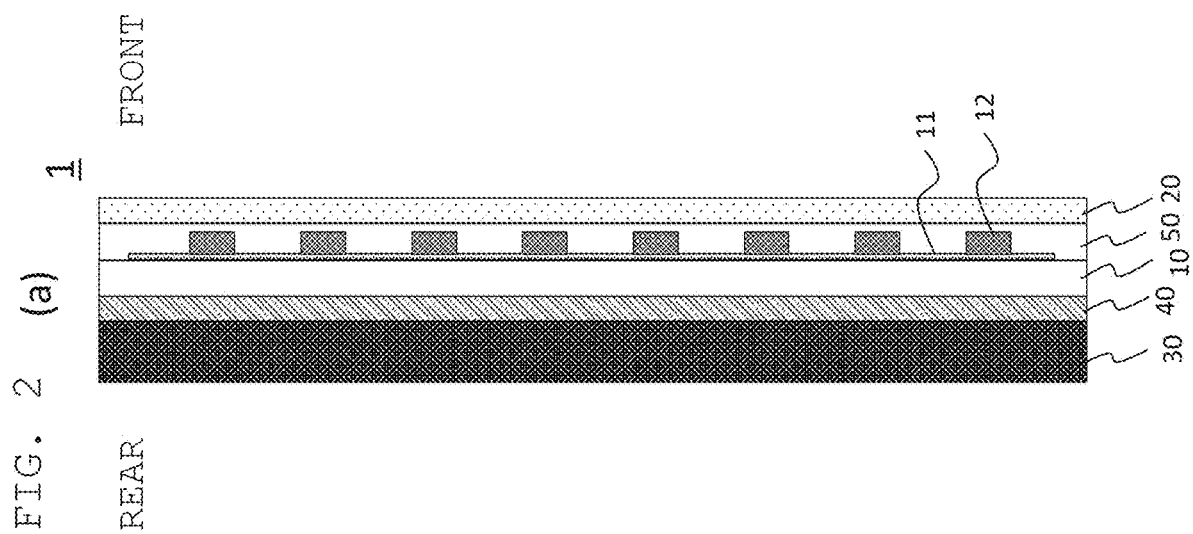
FIG. 2(a) is a cross-sectional view schematically illustrating a structure of the on-vehicle illumination device according to the first embodiment.
FIG. 2(b) is an enlarged cross-sectional view of FIG. 2(a).
Figure 3:
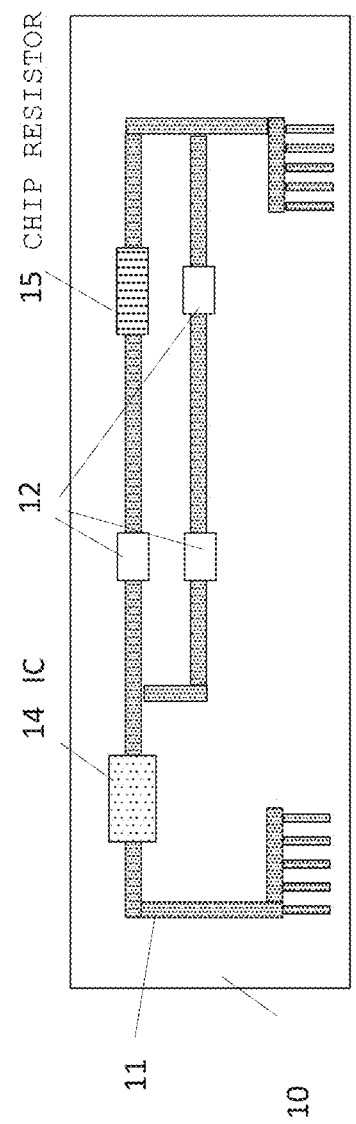
FIG. 3 is a top view schematically illustrating a part of a structure of a wiring pattern on a substrate 10 of the on-vehicle illumination device according to the first embodiment.

An on-vehicle illumination device 1 according to a first embodiment will be described with reference to the drawings. FIG. 1(a) is a perspective view of the on-vehicle illumination device 1 according to the present embodiment, and FIG. 1(b) is a cross-sectional view thereof. FIG. 2(a) is a view schematically illustrating a cross-sectional structure of the on-vehicle illumination device 1, and FIG. 2(b) is a view obtained by enlarging a part of FIG. 1(a). FIG. 3 is a view illustrating an example of a part of a wiring pattern on a substrate.

As illustrated in FIGS. 1(a) and 1(b) and FIGS. 2(a) and 2(b), the on-vehicle illumination device 1 according to the first embodiment includes a substrate 10 and a wiring pattern 11 which is mounted on the substrate 10. Light-emitting elements 12 are disposed on the wiring pattern 11. A sealing resin layer 50, which covers the light-emitting elements 12 and covers the wiring pattern 11 and at least a part of an upper surface of the substrate 10, is disposed on the light-emitting elements 12. An outer lens layer 20 is disposed on the sealing resin layer 50.

The wiring pattern 11 and electrodes of the light-emitting elements 12 are bonded by a bonding material 13. The bonding material 13 is a metal which is obtained by sintering metal particles.

The outer lens layer 20 is integrated with the upper surface of the substrate 10, the light-emitting elements 12, and the wiring pattern 11 in close contact without a gap. Specifically, in the outer lens layer 20, a portion where the sealing resin layer 50 is disposed is in close contact with the sealing resin layer 50, and a portion where the sealing resin layer 50 is not disposed is in direct close contact with and integrated with the upper surface of the substrate 10, the light-emitting element 12, and the wiring pattern 11.

The outer lens layer 20 is formed by insert molding using a pre-prepared mold in which a desired upper surface shape of the outer lens layer is formed. That is to say, the outer lens layer 20 is formed by disposing the substrate 10 on which the light-emitting elements 12 are mounted inside the mold, filling a resin in the mold, and curing the resin.

In this way, in the present embodiment, since the sintered metal particles are used as a bonding material, sintering can be performed at a relatively low temperature during bonding by photosintering or the like. Furthermore, since a bulk form is achieved through sintering, a melting point becomes higher than that of a solder. Therefore, even when the heat-molten resin is poured into a mold in insert molding or the like, the bonding material 13 is not remelted, and the outer lens layer 20 integrated with the light-emitting elements 12 and the substrate 10 can be formed.

Hence, according to the present embodiment, it is possible to provide the on-vehicle illumination device 1 which does not have a space therein and is compact. Furthermore, since the on-vehicle illumination device 1 can be molded using a mold, it is also possible to form the outer lens layer 20 into a complex curved surface shape.

Figure 1:
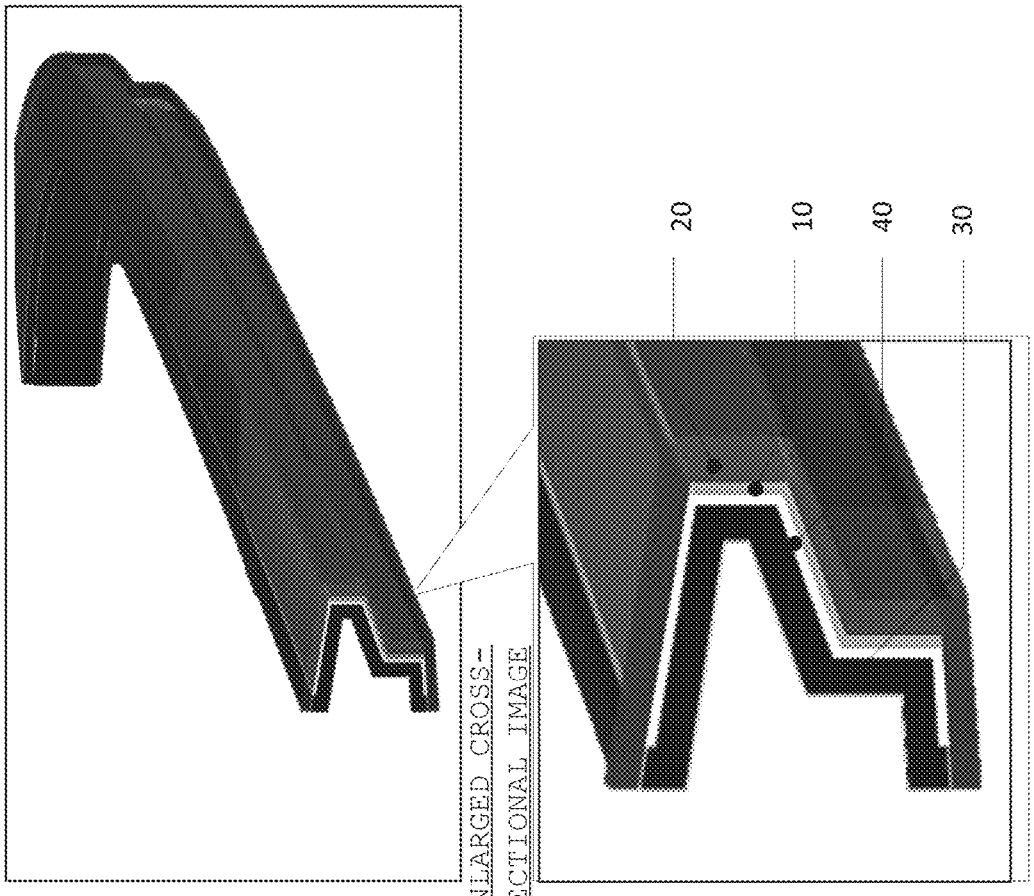
FIG. 1(a) is a perspective view of an on-vehicle illumination device according to a first embodiment of the invention.
FIG. 1(b) is a perspective view of a cross-section of the on-vehicle illumination device.

An on-vehicle illumination device of FIG. 1 has a shape (a convex shape) which is curved in a front-rear direction and an up-down direction. The front-rear direction refers to a direction that coincides with a front-rear direction of a vehicle when the on-vehicle illumination device is installed on the vehicle. The substrate 10 is curved in the front-rear and up-down directions while being in close contact with the outer lens layer 20. In other words, the substrate 10 is curved in a shape which follows a curvature of the outer lens layer 20 in the front-rear direction and the up-down direction.

In FIGS. 2(a) and 2(b), the peripheries of the light-emitting elements 12 are sealed by the sealing resin layer 50, but the sealing resin layer 50 may not be provided. In that case, the outer lens layer 20 is in direct close contact with the light-emitting elements 12, the wiring pattern 11, and the upper surface of the substrate 10.

The light-emitting element 12 may be an LED die which includes electrodes and a semiconductor layer including a light-emitting layer and does not include a package, an LED package in which an LED die is mounted on a submount substrate on which submount electrodes are formed and a sealing resin, a fluorescent layer, or a reflective resin layer is filled around the LED die as necessary, an element having a light receiving function, or a semiconductor laser element.

In addition, when the light-emitting element 12 is an LED package in which an LED die is mounted on a submount substrate on which submount electrodes are formed and a sealing resin, a fluorescent layer, or a reflective resin layer is filled around the LED die as necessary, as a die bonding material for bonding the submount electrodes and electrodes for the LED die, a metal obtained by sintering metal particles is used instead of using a solder. By this fact, when molding the outer lens layer 20, it is possible to prevent the LED die from falling off from the submount substrate.

As illustrated in FIG. 3, in addition to the light-emitting elements 12, electronic circuit elements 14 and 15 can be mounted on the wiring pattern 11. For example, the electronic circuit elements 14 and 15 are an IC (integrated circuit) chip which drives the light-emitting elements 12 and a chip resistor, respectively. The outer lens layer 20 is integrated with the electronic circuit elements 14 and 15 in close contact without a gap.

As a bonding material for bonding the electrodes of the electronic circuit elements 14 and 15 and the wiring pattern 11, a metal obtained by sintering metal particles is used.

Bonding may be performed by using oven heating such as reflow, direct heating with a heat tool, or heating by light such as a flash or a laser when the substrate 10 has optical transparency. In the case of bonding by light, in a production process, it is possible to perform irradiation with light from a rear surface side of the substrate 10 toward the position of the bonding material 13, heat the wiring pattern 11 and the bonding material 13 by light, and sinter the bonding material 13.

As illustrated in FIGS. 1(a) and 1(b) and FIGS. 2(a) and 2(b), a housing 30 having a shape which follows the substrate is in close contact with and fixed to a lower surface of the substrate 10.

The housing 30 is curved in a shape which follows the curvatures (convex shape) of the substrate 10 and the outer lens layer 20 in the front-rear direction and the up-down direction, and is in close contact with the substrate 10 and the outer lens layer 20. A back surface of the housing 30 has a shape which follows the curvature of the outer lens layer 20 in the front-rear direction and the up-down direction.

Therefore, by making the on-vehicle illumination device 1, which is installed at the front of the vehicle, in a curved shape which is convex toward the front, a space which is surrounded by the curved shape of the on-vehicle illumination device 1 can be created on a back surface (rear side) of the on-vehicle illumination device 1 installed at the front of the vehicle. Similarly, by making the on-vehicle illumination device 1, which is installed at the rear of the vehicle, in a curved shape which is convex toward the rear, a space which is surrounded by the curved shape of the on-vehicle illumination device 1 can be created on the back surface (front side) of the on-vehicle illumination device 1 installed at the rear of the vehicle.

Moreover, a decorative film 40 such as a reflector which reflects light generated from the light-emitting elements 12 may be inserted between the substrate 10 and the housing 30. In this case, the upper surface of the decorative film 40 is in close contact with the lower surface of the substrate 10, and the lower surface of the decorative film 40 is in close contact with the upper surface of the housing 30. The decorative film 40 also has a shape which bulges in the front-rear direction and the up-down direction along the outer lens layer 20.

<Material>
(Substrate 10)

As the substrate 10, a resin material such as highly heat-resistant PET (polyethylene terephthalate), PI (polyimide), and glass epoxy or a metal-based substrate such as an aluminum substrate can be used. Preferably, a flexible material is used. It is desirable to select a material for the substrate 10, which has a melting point or a softening point higher than a temperature (150 to 320° C.) when molding the outer lens layer 20 and which does not cause deformation or alteration during molding.

The thickness of the substrate 10 is, for example, 25 μm to 2 mm.

(Wiring Pattern 11)

The wiring pattern 11 can be formed by bonding a metal foil such as a copper foil to the substrate 10 and processing the metal foil into a shape of the wiring pattern 11. Alternatively, the wiring pattern 11 may be formed by forming a metal film on the substrate 10 by sputtering or the like and processing the metal film into the shape of the wiring pattern 11 by etching. Furthermore, the wiring pattern 11 may be formed by applying a conductive ink or the like onto the substrate 10 in the shape of the wiring pattern 11 and then heating and sintering the conductive ink.

The thickness of the wiring pattern 11 is, for example, about 12 μm to 35 μm.

When forming a conductive ink on a substrate, a technique such as gravure printing or screen printing can be used.

In addition, similarly to the bonding material 13, the bonding material 13 and the wiring pattern 11 may be formed simultaneously by using a conductive ink in which metal particles are dispersed in a solvent.

(Adhesive)

When the wiring pattern 11 is formed by processing a metal foil, the metal foil is fixed to the substrate 10 by an adhesive.

As the adhesive, polyurethane ester type, acrylic type, epoxy type, silicone type, or the like can be used.

The thickness of the adhesive is, for example, 5 to 100 μm.

As a method of bonding the substrate 10 and the wiring pattern 11 with the adhesive, a method such as dry lamination can be used.

In addition to the adhesive, for example, an adhesive sheet can also be used. In that case, bonding may be performed using thermocompression, lamination, or the like.

(Bonding Material 13)

The bonding material 13 is formed by sintering an ink or paste in which conductive metal nanoparticles are dispersed.

The composition of the conductive ink or paste is preferably in the range of 20 wt % to 95 wt % of conductive particles, 5 wt % to 70 wt % of a solvent, and 0.01 wt % to 10 wt % of an organic dispersant.

As a material configuring the conductive particles, for example, one or more of conductive metals and a conductive metal oxide such as Au, Ag, Cu, Pd, ITO, Ni, Pt, and Fe can be used.

A maximum value of the particle size distribution of the conductive particles is preferably 1 nm or more and 10 μm or less.

As the solvent, glycol such as ethylene glycol, diethylene glycol, triethylene glycol, and polyethylene glycol, diol such as propanediol, butanediol, and benzenediol, triol such as glycerin, and ether such as diethyl ether and diphenyl ether can be used.

As a sintering method, in addition to heating with an oven or the like, irradiation with electromagnetic waves such as light can be used. Specifically, for example, laser or flash heating can be used.

For example, as a mounting method, on the wiring pattern 11 and the land of the substrate 10, the conductive ink or paste is formed using dispensing or screen printing, and the light-emitting elements 12 and the electronic circuit elements 14 and 15 are installed. The conductive ink or paste is heated to a temperature of 200 to 400° C. to melt and sinter the conductive particles.

When installing the light-emitting elements 12 and the electronic circuit elements 14 and 15 on the conductive ink or paste of the wiring pattern 11 or the land, a jig such as a collet may be used to fix or apply a load, or heating may be performed while applying a load.

(Sealing Resin Layer 50)

As a material of the sealing resin layer 50, a resin which is transparent to light emitted by the light-emitting elements 12 is used. For example, an epoxy, urethane-based resin, a silicone resin, or a modified resin as a combination thereof can be used.

(Outer Lens Layer 20)

As a resin used to mold the outer lens layer 20, PMMA (polymethyl methacrylate), ABS (acrylonitrile-butadiene-styrene copolymer synthetic resin), PP (polypropylene), PC (polycarbonate), PBT (polybutylene terephthalate), PES (polyether sulfone) or the like can be used.

(Decorative Film 40)

As the decorative film 40, a reflective layer which functions as a reflector, or a design layer as a display function, such as a wood grain or a metal pattern with semi-transparency which has a light-diffusing or light-shielding effect, is used.

<Production Method>

Figure 4:
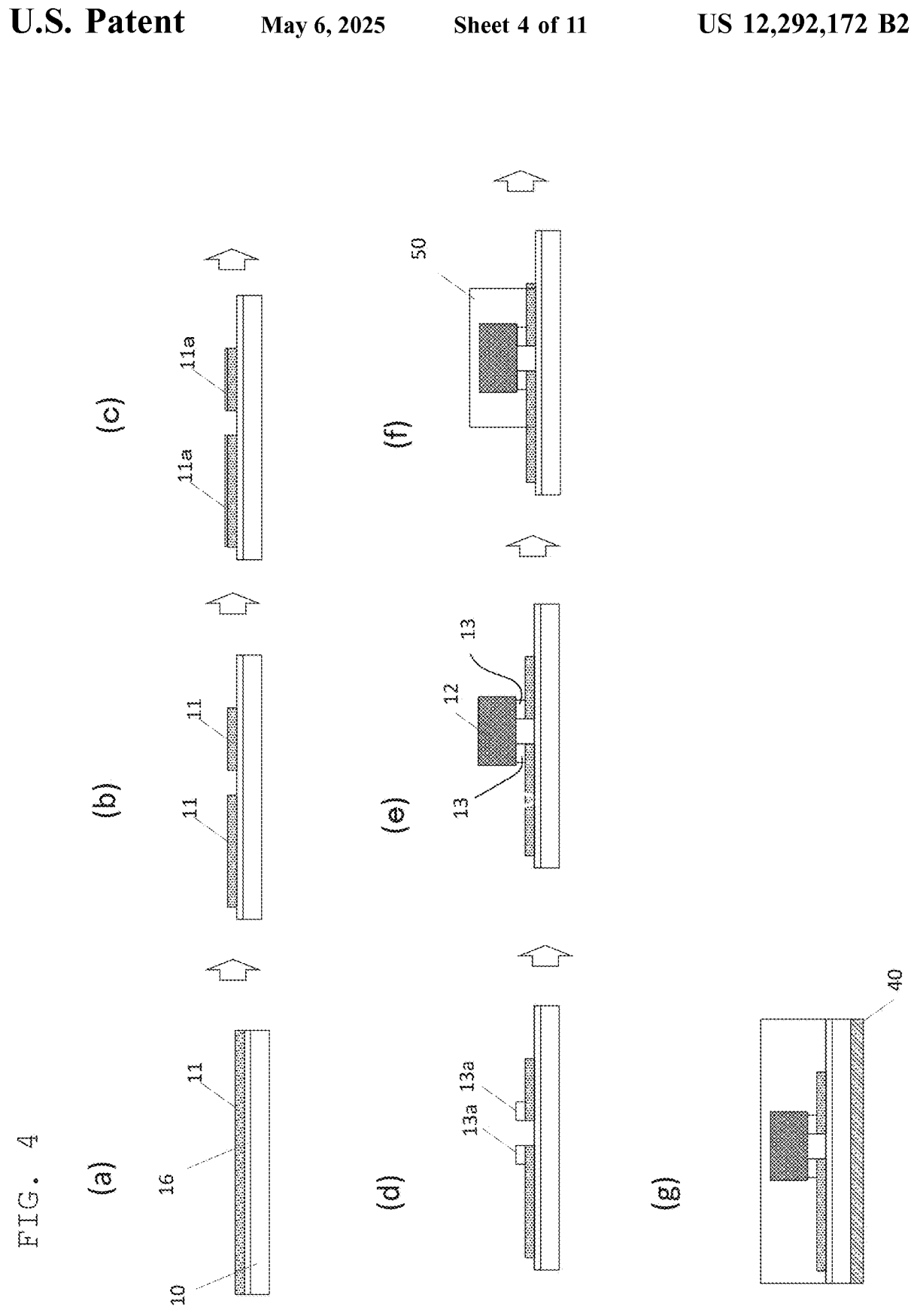
FIGS. 4(a) to 4(g) are cross-sectional views illustrating production processes of the on-vehicle illumination device according to the first embodiment.
Figure 5:
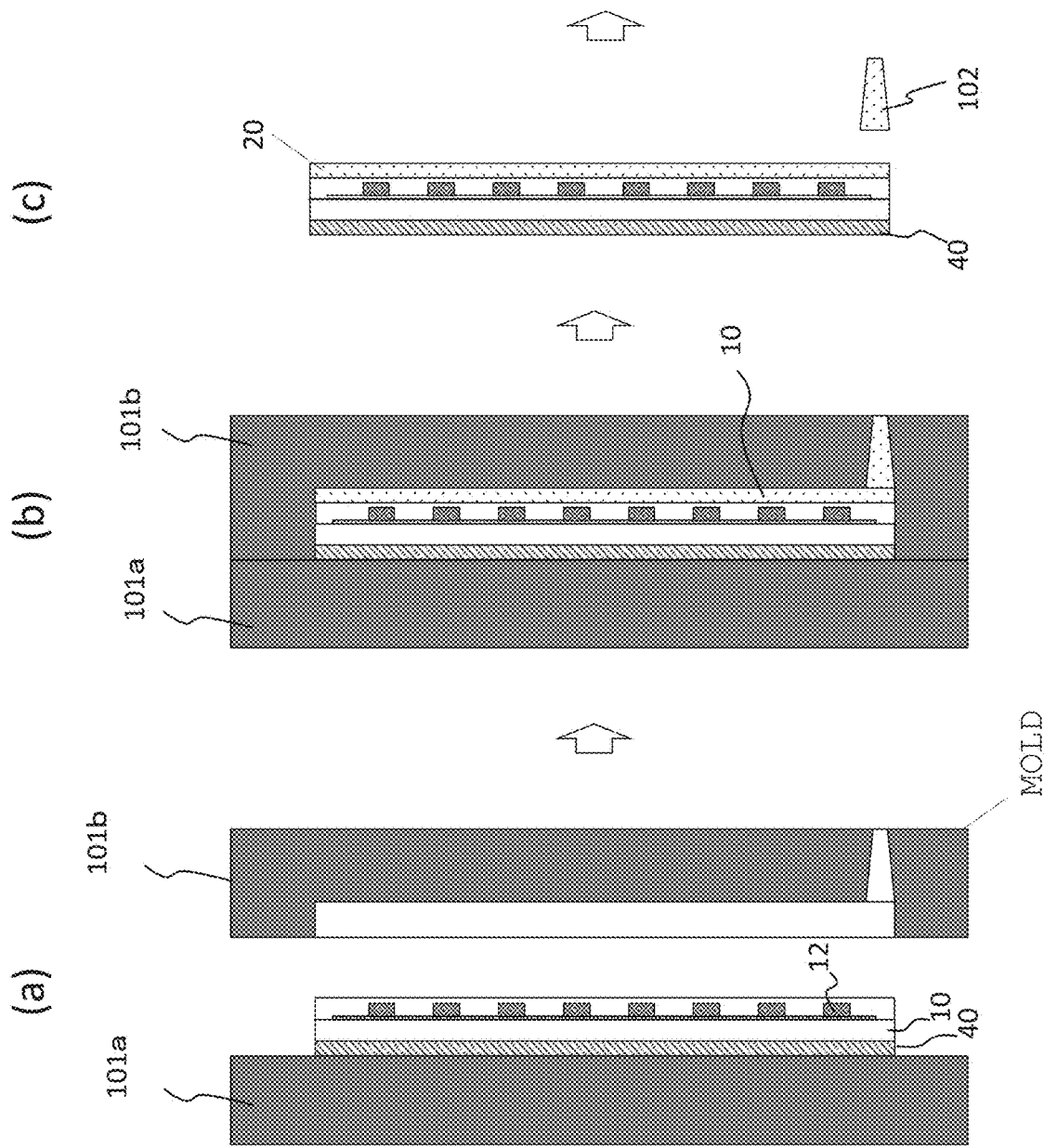
FIGS. 5(a) to 5(c) are cross-sectional views illustrating the production processes of the on-vehicle illumination device according to the first embodiment.

An example of a production method according to the present embodiment will be described using FIGS. 4 and 5.

(Process of FIG. 4(a))

First, a polyimide film with a thickness of 25 μm to 50 μm was prepared as the substrate 10. A copper foil with a thickness of 12 to 35 μm configuring the wiring pattern 11 is bonded using an adhesive layer 16 as described above.
(Process of FIG. 4(b))

The copper foil is patterned into a desired shape of the wiring pattern 11 by subtractive etching.
(Process of FIG. 4(c))

A surface treatment layer 11a is formed on the surface of the copper foil. For example, a Ni layer and an Au layer are sequentially formed as the surface treatment layer 11a by electroless Ni plating and electroless gold plating.

As an example, the thickness of the Ni layer is 1 to 5 μm, and the thickness of the Au layer is about 0.03 μm.

In addition to the plating method, a water-soluble preflux may be used.
(Process of FIG. 4(d))

The above-mentioned conductive ink is prepared and applied to respective regions of the wiring pattern 11 where the electrodes of the light-emitting elements 12 and the electronic circuit elements 14 and 15 are mounted, to form a coating film 13a.
(Process of FIG. 4(e))

The light-emitting elements 12 and the electronic circuit elements 14 and 15 are mounted on the coating film 13a of the conductive ink using a device. If necessary, while applying a load to the light-emitting elements 12 and the electronic circuit elements 14 and 15, irradiation with laser light from the rear surface side of the substrate 10 is performed. By this fact, the wiring pattern 11 is heated, and the conductive particles of the coating film 13a of the conductive ink are melted and sintered by heat transfer. The bonding material 13 for bonding the light-emitting elements 12 and the like and the wiring pattern 11 is formed.
(Process of FIG. 4(f))

A resin such as a silicone resin is filled around the light-emitting elements 12 on the substrate 10 using dispense coating, a mold, or the like, and is heated and cured to form the sealing resin layer 50.

The curing temperature of the resin is, for example, about 150° C., depending on a resin to be used.

Depending on the light-emitting elements 12, the sealing resin layer 50 may not be formed.

The sealing resin layer 50 may be formed over the entire upper surface of the substrate 10 or may be partially formed.
(Process of FIG. 4(g))

The decorative film 40 prepared in advance is bonded to a rear surface of the substrate 10 using an adhesive layer. For example, a reflector is used as the decorative film 40. As an adhesive configuring the adhesive layer, the adhesive used to bond the copper foil and the substrate 10 in the process of FIG. 4(a) can be used.

Moreover, the decorative film 40 may be formed on the lower surface of the substrate by printing.
(Process of FIG. 5(a))

The stack, which is manufactured in the processes of FIGS. 4(a) to 4(g) and in which the light-emitting elements 12 are mounted on the substrate 10 and the decorative film 40 is disposed on the rear surface of the substrate 10, is set inside molding molds 101a and 101b.

At this time, three-dimensional forming may be performed to obtain a desired shape.
(Process of FIG. 5(b))

In order to form the outer lens layer 20, a PC (polycarbonate) resin is heated to about 260 to 320° C. The molds 101a and 101b are heated to about 70 to 110° C.

The heated and fluidic PC resin is injected into the molds 101a and 101b and is then cured, and thereby, the outer lens layer 20 having the desired shape is integrally formed by insert molding in close contact with the substrate 10, the light-emitting elements 12, the wiring pattern 11, and the like.
(Process of FIG. 5(c))

The integrally molded product is removed from the molds 101a and 101b, and a nozzle mark 102 on the outer lens layer 20 is cut and removed.
(Process of FIG. 6)

The housing 30 is bonded, by the above-described adhesive, to the rear surface of the substrate 10 of the molded product which is obtained in the process of FIG. 5(c) and in which the substrate 10 and the like and the outer lens layer 20 are integrally molded.

Instead of the adhesive, the substrate 10 and the housing 30 may be fixed to each other by a fitting structure such as a snap fit, or may be formed by two-color molding or the like.

Through the above processes, the on-vehicle illumination device 1 according to the first embodiment can be produced.

The on-vehicle illumination device 1 according to the present embodiment produced as described above uses a conductive ink in which conductive nanoparticles are dispersed in a solvent, in order to form the bonding material 13 (FIG. 4(d)). As a result, due to a melting point drop that is a property of nanoparticles, conductive nanoparticles can be sintered at a lower melting point than a normal bulk body (FIG. 4(e)).

In addition, since the conductive nanoparticles after sintering have properties close to those of a bulk, a melting point drop does not occur, and even at a high temperature when the outer lens layer 20 is molded using a mold, the conductive nanoparticles are not remelted, and mounted components (such as the light-emitting elements 12) do not fall off (FIG. 5(b)).

Also, since the bonding material 13 which is a sintered body of conductive particles has the above-mentioned bulk properties, thermal and electrical properties are superior to a resin-curing type such as a silver paste.

The on-vehicle illumination device 1 according to the first embodiment is thin because there is no internal space. Further, since there is no need for screwing or the like and the number of parts can be reduced compared to the related art, weight reduction and simplification are possible.

FIGS. 7(a) and 7(b) are diagrams illustrating the internal space of a vehicle when the vehicle equipped with the on-vehicle illumination device 1 according to the first embodiment is viewed from the side and the top, respectively. FIGS. 7(c) and 7(b) are diagrams illustrating the internal space of a vehicle when the vehicle equipped with an illumination device in the related art is viewed from the side and the top, respectively. As illustrated in FIGS. 7(a) and 7(b), the on-vehicle illumination device 1 according to the first embodiment can reduce an installation space when being installed on a vehicle, compared to the illumination device in the related art of FIGS. 7(c) and 7(d). Therefore, it becomes possible to effectively utilize the internal space of the vehicle.

Specifically, in the on-vehicle illumination device 1 according to the first embodiment, since the back surface of the on-vehicle illumination device 1 itself has a curved shape which follows the shape of the curvature of the outer lens layer 20 in the front-rear direction and the up-down direction, as illustrated in FIG. 7(b), a space 71 surrounded by the curved shape of the on-vehicle illumination device 1 is created on the back surface (rear side) of the on-vehicle illumination device 1 installed at the front of the vehicle. A space 72 surrounded by the curved shape of the on-vehicle illumination device 1 is created on the back surface (front side) of the on-vehicle illumination device 1 installed at the rear of the vehicle. The spaces 71 and 72 are spaces that are not present in a vehicle on which the illumination device in the related art is installed (FIG. 7(d)). Therefore, by installing the on-vehicle illumination device 1 according to the first embodiment, as illustrated in FIG. 7(c), a part of an engine room or a trunk room of the vehicle may be disposed in the spaces 71 and 72 on the back surface of the on-vehicle illumination device 1 according to the first embodiment. Conversely, in the vehicle equipped with the illumination device in the related art, as can be clearly seen from FIG. 7(d), a space equal to the thickness of the illumination device in the front-rear direction is required to install the illumination device, and it can be seen that, by the corresponding space, the engine room or the trunk room is reduced. Therefore, the on-vehicle illumination device 1 according to the first embodiment can effectively utilize the internal space of the vehicle, compared to the illumination device in the related art.

Furthermore, by molding the molds 101a and 101b into a desired shape in advance, the on-vehicle illumination device 1 according to the first embodiment can be easily molded into a complex three-dimensional shape. Therefore, there is no need for a complicated assembly structure, and as illustrated in FIGS. 1(a) and 1(b), it is possible to produce an on-vehicle illumination device with a curved shape relatively easily at low cost. Therefore, it is possible to produce a compact and low-cost on-vehicle illumination device having a high design quality with a curved surface matching the design of a vehicle.

Second Embodiment

As a second embodiment, a production method for an on-vehicle illumination device which does not include the decorative film 40 will be described.

In the on-vehicle illumination device according to the second embodiment, when, by performing the processes of FIGS. 4(a) to 4(f) of the first embodiment, the wiring pattern 11 is formed on the substrate 10 and the light-emitting elements 12 are bonded, the process of FIG. 4(g) is not performed. As a result, the decorative film 40 is not provided. The processes of FIGS. 8(a) to 8(c) are performed using the substrate 10 obtained in FIG. 4(f), to which the light-emitting elements 12 are bonded.

Figure 8:
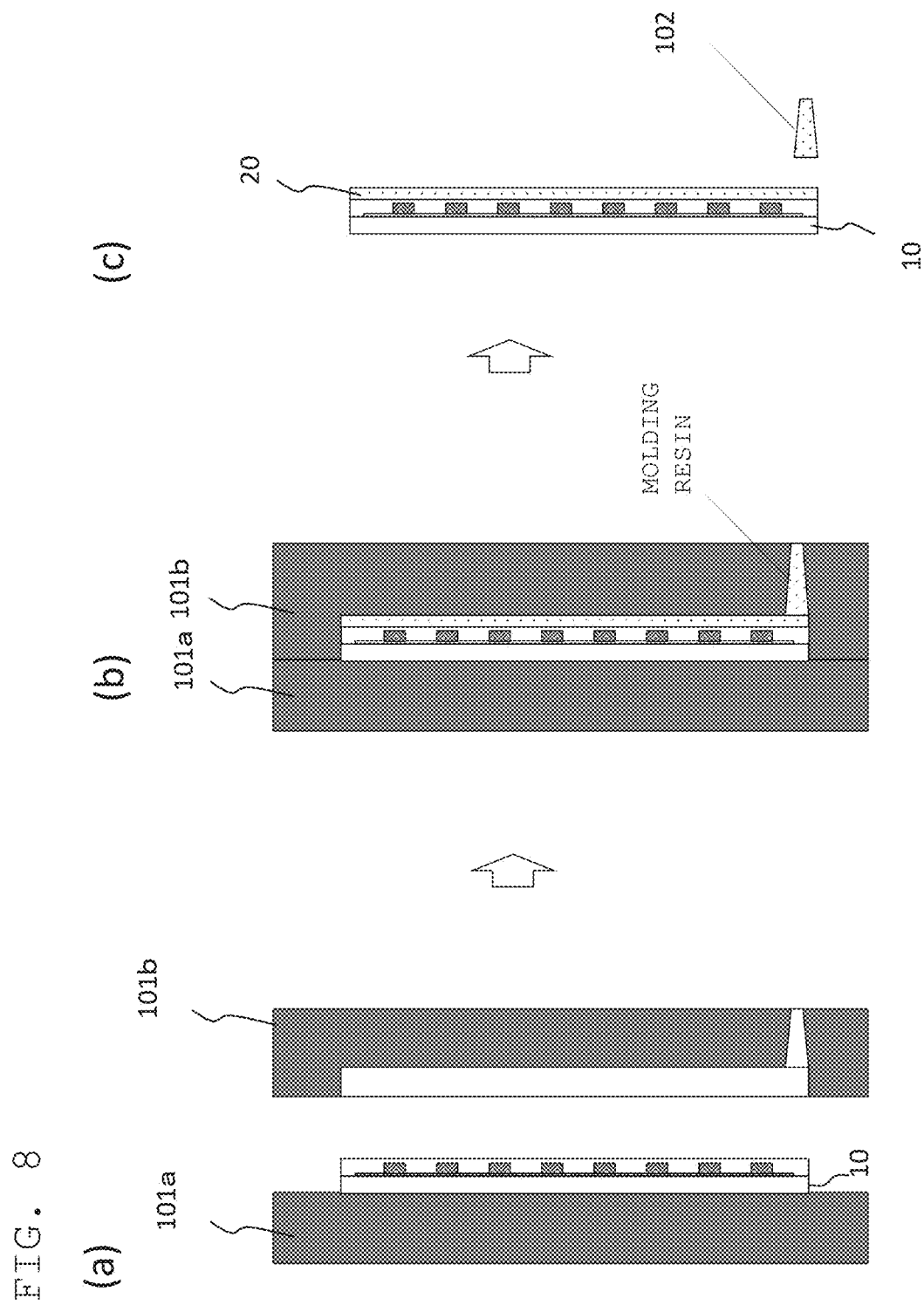
FIGS. 8(a) to 8(c) are cross-sectional views illustrating production processes of an on-vehicle illumination device according to a second embodiment.

FIGS. 8(a) to 8(c) are similar to FIGS. 5(a) to 5(c) of the first embodiment, but without the decorative film 40 obtained in FIG. 4(f), a stack of the substrate 10, the light-emitting elements 12, and the like is disposed in the molds 101a and 101b, and a resin is filled in the molds 101a and 101b. As a result, the outer lens layer 20 with a desired shape is integrally formed by insert molding in close contact with the substrate 10, the light-emitting elements 12, the wiring pattern 11, and the like.

Thereafter, similarly to the process of FIG. 6, the housing 30 is bonded to the lower surface of the substrate 10 in close contact without a gap.

Since other configurations, actions, and effects are the same as those in the first embodiment, descriptions thereof will be omitted.

Third Embodiment

As a third embodiment, a production method for a three-dimensional on-vehicle illumination device will be described using FIGS. 9(a) to 9(d).

Figure 9:
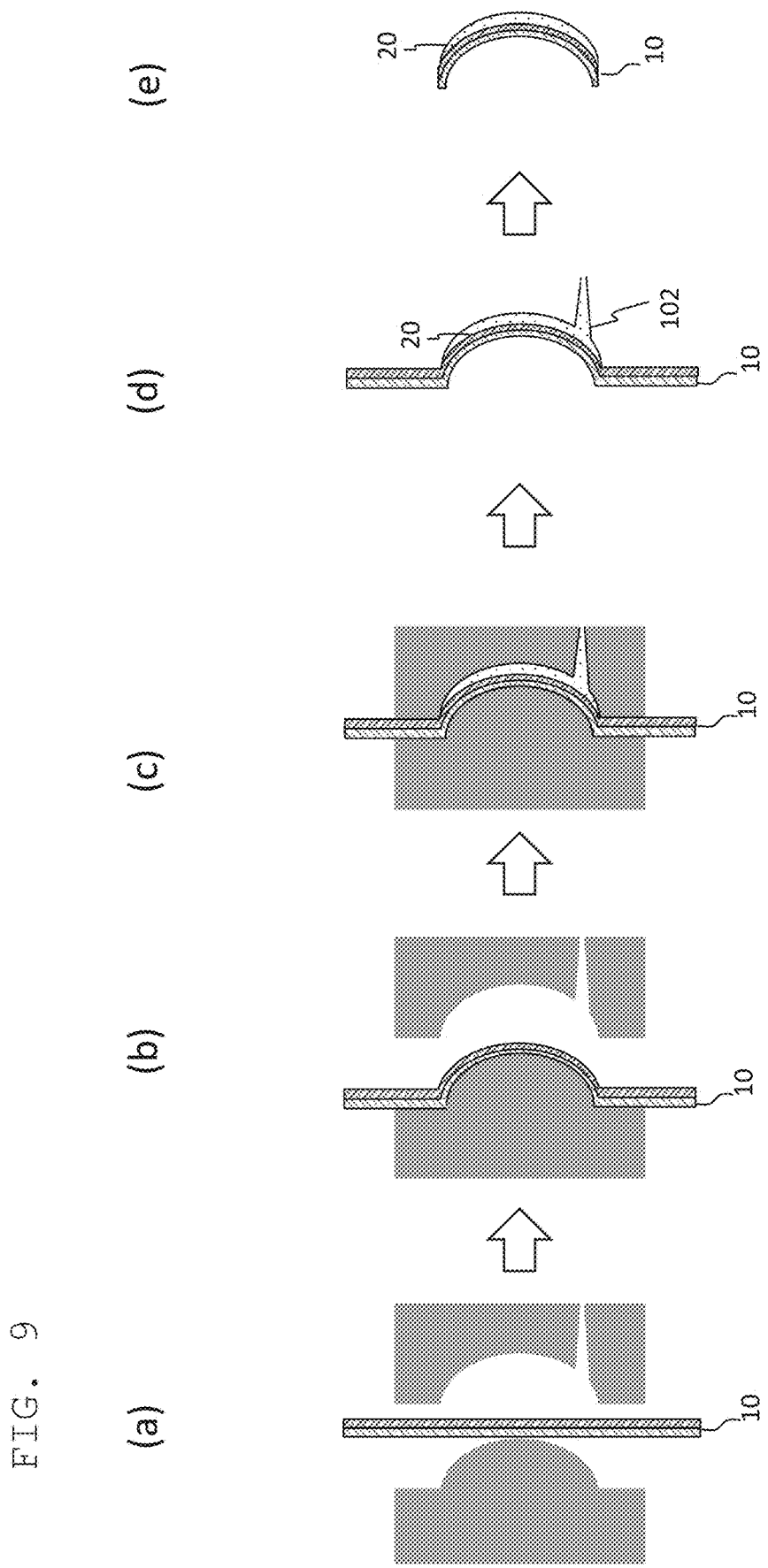
FIGS. 9(a) to 9(e) are cross-sectional views illustrating production processes of an on-vehicle illumination device according to a third embodiment.

(Process of FIG. 9(a))

As illustrated in FIG. 9(a), molds 101a and 101b are formed in advance into a desired three-dimensional shape. The stack manufactured in the processes of FIGS. 4(a) to 4(g) of the first embodiment or the stack manufactured in the processes of FIGS. 4(a) to 4(f) is disposed inside the molds 101a and 101b. In the stack manufactured in the processes of FIGS. 4(a) to 4(g), the light-emitting elements 12 are stacked on the substrate 10, and the decorative film is bonded to the lower surface of the substrate 10. In the stack manufactured in the processes of FIGS. 4(a) to 4(g), the light-emitting elements 12 are stacked on the substrate 10, and a decorative film is not provided.

(Process of FIG. 9(b))

As illustrated in FIG. 9(b), the substrate 10 is inserted into the molds, the substrate 10 is softened by heating, and the shape of the stack is changed into a desired three-dimensional shape by vacuum molding, pressure molding, press molding, or the like. The process may be divided into two, and a complex shape can be formed by using not only heating but also vacuum forming. In this case, molds suitable for each process are used. In the case of one process, the upper molds of FIG. 9(b) and FIG. 9(c) are the same mold.

(Process of FIG. 9(c))

Similarly to the process of FIG. 5(b), the molds 101a and 101b are heated, and the heated and fluidic PC resin is injected into the molds 101a and 101b and is then cured. As a result, the outer lens layer 20 having a desired three-dimensional shape is integrally formed by insert molding in close contact with the substrate 10, the light-emitting elements 12, the wiring pattern 11, and the like.

(Processes of FIGS. 9(d) and 9(e))

The integrally molded product is removed from the molds 101a and 101b, and the nozzle mark 102 is removed. When there is an unnecessary portion on the peripheral edge of the substrate 10, the unnecessary portion is removed by cutting.

Thereafter, similarly to the process of FIG. 6, the separately formed three-dimensional housing 30 is bonded to the lower surface of the three-dimensional substrate 10 in close contact without a gap.

As described above, according to the third embodiment, the substrate 10 can be changed into a three-dimensional shape, and at the same time, the outer lens layer 20 can be integrally molded into a shape which is in close contact with the substrate 10, so that a complex three-dimensional shape may be easily formed.

Therefore, there is no need for a complicated assembly configuration, and the on-vehicle illumination device with a curved shape illustrated in FIGS. 1(a) and 1(b) can be relatively easily produced at low cost. Therefore, it is possible to produce, at low cost, an on-vehicle illumination device which is thin and lightweight, and has a high design quality while having a curved surface matching the design of a vehicle.

<First Modification>

On-vehicle illumination devices according to various modifications of the first to third embodiments will be described using FIGS. 10(a) to 10(j). In FIGS. 10(a) to 10(j), the illustration of the wiring pattern 11, the light-emitting elements 12, the sealing resin layer 50, and the housing 30 is omitted.

FIG. 10(a) is an example in which the on-vehicle illumination device according to the second embodiment is formed into a flat plate shape (two-dimensional shape).

FIG. 10(b) is an example in which, as described in the third embodiment, the on-vehicle illumination device according to the second embodiment is formed into a three-dimensional shape by three-dimensional molding.

As illustrated in FIG. 10(c), as the outer lens layer 20 of the on-vehicle illumination device, at least two types of resin layers 20-1 and 20-2 may be molded in different regions, respectively, of the substrate 10 (two-color molding).

Furthermore, as illustrated in FIG. 10(d), the outer lens layer 20 of the on-vehicle illumination device can of course be provided so as to cover only a partial region of the substrate 10.

Furthermore, as illustrated in FIG. 10(e), the outer lens layer 20 of the on-vehicle illumination device can be provided not only on the upper surface of the substrate 10 but also on the lower surface side.

As illustrated in FIG. 10(h), as the outer lens layer 20 of the on-vehicle illumination device, at least two types of different material layers 20-3 and 20-4 may be molded in different regions, respectively, of the substrate 10 (two-color molding).

Although FIGS. 10(c) to 10(e) and 10(h) illustrate examples of the on-vehicle illumination device according to the second embodiment, the same can be applied to the on-vehicle illumination device according to the first embodiment.

FIG. 10(f) is an example in which an on-vehicle illumination device including the decorative film 40 on the lower surface of the substrate 10 of the first embodiment is formed into a flat plate shape (two-dimensional shape).

As illustrated in FIG. 10(g), the decorative film 40 may be disposed only in a partial region of the substrate 10.

Moreover, as illustrated in FIG. 10(i), the decorative film 40 may be disposed on the upper surface side of the substrate 10. For example, it is possible to dispose the decorative film 40 between the sealing resin layer 50 and the outer lens layer 20, or it is also possible to make the sealing resin layer 50 have the function of the decorative film 40 as well.

Furthermore, as illustrated in FIG. 10(j), the decorative film 40 may be disposed on both surfaces of the substrate 10.

When the decorative film 40 is attached to the upper surface of the substrate 10, for example, a layer of a black semi-transparent resin or the like is used.

The on-vehicle illumination device illustrated in FIGS. 10(c) to 10(j) described above can also be molded into a three-dimensional shape as illustrated in FIG. 10(b).

Also, it is possible to combine the modifications of the outer lens layer 20 illustrated in FIGS. 10(c) to 10(e) and 10(h) and the modifications of the decorative film 40 illustrated in FIGS. 10(f), 10(g), 10(i), and 10(j).

<Second Modification>

FIG. 11 is an on-vehicle illumination device according to a further modification which does not use insert molding.

The on-vehicle illumination device illustrated in FIG. 11 has an outer lens 22 at the front, and is formed with a housing 32 on the back surface. In the present modification, two substrates 17 on which the light-emitting elements 12 are arranged are provided, and are installed to overlap with each other. At least the substrate 17 which is disposed at the front is a light-transmitting substrate, and transmits light from the light-emitting elements 12 which are arranged on the substrate 17 mounted on the back surface. Further, the two substrates 17 are flexible substrates.

In the present modification, the outer lens 22 and the housing 32 are individually molded. The outer lens 22 and the housing 32 are fixed with the two substrates 17 sandwiched therebetween. For fixing, screws (not illustrated) or the like are used.

In the present modification, a space is created between the outer lens 22, the substrate 17, and the housing 32. However, since the substrate 17 and the housing 32 are also curved in a shape which follows the curvature provided in the front-rear direction and the up-down direction of the outer lens 22, the created internal space is extremely thin. Therefore, the effect of effectively utilizing the internal space of the vehicle described using FIGS. 7(a) and 7(b) also occurs in the same manner in the present modification.

Application Example

The on-vehicle illumination device according to each embodiment described above is suitable for a unit in which an electronic component and a mold form a set, such as a headlight, a rear lamp, a high-mount stop lamp, a DR-L, and a rider.

In addition to an on-vehicle illumination device, the on-vehicle illumination device according to each embodiment described above is also suitable for a flat plate-shaped or three-dimensional lighting device used in a home appliance, an information device, a medical instrument, or the like, an on-vehicle interior light, an air conditioner panel, or the like.

REFERENCE SIGNS LIST

1: on-vehicle illumination device
10: substrate
11: wiring pattern
11a: surface treatment layer
12: light-emitting element
13: bonding material
13a: coating film
14, 15: electronic circuit elements
16: adhesive layer
20, 20-1, 20-2, 20-3, 20-4: outer lens layers
30: housing
40: decorative films
50: sealing resin layer
101a, 101b: molding molds
102: nozzle mark

The invention claimed is:

1. An on-vehicle illumination device comprising:
a substrate;
a wiring pattern mounted on an upper surface of the substrate;
a plurality of light-emitting elements disposed on the wiring pattern; and
an outer lens layer made of resin which is mounted on the light-emitting elements, wherein
the upper surface of the substrate has a curved shape in a front-rear direction of the vehicle, such that a curvature direction, of the substrate, varies along the front-rear direction, and the front-rear direction coincides with a front-rear axis of the vehicle,
the outer lens layer has a continuously curved shape following a curvature of the upper surface of the substrate,
the light-emitting elements are arranged along the curvature direction of the substrate,
at least a part of the light-emitting elements, the wiring pattern and the upper surface of the substrate is covered by a sealing resin layer, the outer lens layer is integrated with the light-emitting elements, the wiring pattern and the upper surface of the substrate via the sealing resin layer in close contact without a gap.

2. The on-vehicle illumination device according to claim 1, the wiring pattern and electrodes of the light-emitting elements are bonded by a bonding material, and the bonding material is a metal made by sintering metal particles.

3. The on-vehicle illumination device according to claim 2, the outer lens layer is integrated with a part of the light-emitting elements, the wiring pattern and the upper surface of the substrate where the sealing resin layer is not disposed in direct close contact without a gap.

4. The on-vehicle illumination device according to claim 1, the outer lens layer is formed by insert molding, in which the substrate on which the light-emitting elements is mounted is disposed in a mold and a resin is filled in the mold.

5. The on-vehicle illumination device according to claim 1, the light-emitting elements are an LED die.

6. The on-vehicle illumination device according to claim 1,
each of the light-emitting elements includes a submount substrate formed with submount electrodes, an LED die mounted on the submount substrate, and a die bonding material for bonding the submount electrodes and electrodes for the LED die, and
the die bonding material is a metal made by sintering metal particles.

7. The on-vehicle illumination device according to claim 1,
an electronic circuit element is further mounted on the wiring pattern, and electrodes of the electronic circuit element are bonded to the wiring pattern using, as a bonding material, a metal made by sintering metal particles, and
the outer lens layer is integrated with the electronic circuit element in close contact without a gap.

8. The on-vehicle illumination device according to claim 1, further comprising a second resin outer lens,
the substrate is transparent,
the second resin outer lens is provided on the surface of the substrate opposite to the surface on which the outer lens is mounted.

9. The on-vehicle illumination device according to claim 1, the outer lens layer is made of any one of PMMA (polymethyl methacrylate), ABS (acrylonitrile-butadiene-styrene copolymer synthetic resin), PP (polypropylene), PC (polycarbonate), PBT (polybutylene terephthalate), and PES (polyether sulfone).

10. The on-vehicle illumination device according to claim 9, the sealing resin layer contains any one of epoxy, urethane-based resin, and silicone resin.

11. The on-vehicle illumination device according to claim 1, the outer lens layer is also curved in the vertical direction, and the substrate is curved along the vertical curvature of the outer lens.

12. An on-vehicle illumination device comprising:
a substrate;
a wiring pattern mounted on an upper surface of the substrate;
a plurality of light-emitting elements disposed on the wiring pattern; and
an outer lens layer made of resin which is mounted on the light-emitting elements, wherein
the upper surface of the substrate has a curved shape in a front-rear direction of the vehicle, such that a curvature direction, of the substrate, varies along the front-rear direction, and the front-rear direction coincides with a front-rear axis of the vehicle,
the outer lens layer has a continuously curved shape following a curvature of the upper surface of the substrate,
the light-emitting elements are arranged along the curvature direction of the substrate,
a lower surface opposite to the upper surface of the substrate has a curved shape following to the upper surface of the substrate,
a housing having a curved shape which follows the curvature of the lower surface of the substrate is fixed to the lower surface of the substrate.

13. The on-vehicle illumination device according to claim 12, a decorative film is inserted between the substrate and the housing, an upper surface of the decorative film is in close contact with the lower surface of the substrate, and a lower surface of the decorative film is in close contact with an upper surface of the housing,
the decorative film is any one of a reflective layer, light-diffusing layer and a semi-transparency layer.

14. The on-vehicle illumination device according to claim 12, the outer lens layer is integrated with the light-emitting elements, the wiring pattern and the upper surface of the substrate in close contact without a gap.

15. A production method for an on-vehicle illumination device curved in a front-rear direction of the vehicle comprising:
an applying and mounting process of applying a bonding member including metal particles to a wiring pattern on an upper surface of a substrate and mounting a light-emitting element on the bonding member;
a bonding process of bonding the wiring pattern and electrodes of the light-emitting element by heating the bonding member to sinter the metal particles; and
a forming process of bending the substrate in the front-rear direction, such that a curvature direction, of the substrate, varies along the front-rear direction, and the front-rear direction coincides with a front-rear axis of the vehicle, and placing the substrate in a mold of a predetermined shape, filling the mold with resin, and curing resin to form an outer lens layer of a continuously curved shape that conforms to a curvature of the upper surface of substrate, which is integrated with the upper surface of the substrate, the light-emitting element, and the wiring pattern without a gap.

16. The production method for an on-vehicle illumination device according to claim 15, the bonding process is a process in which the bonding member is irradiated with light which is transmitted through the substrate to photosinter the metal particles.

17. A vehicle comprising an on-vehicle illumination device and an engine room or a trunk room,
the on-vehicle illumination device comprising:
a substrate;
a wiring pattern mounted on an upper surface of the substrate;
a plurality of light-emitting elements disposed on the wiring pattern; and
an outer lens layer made of resin which is mounted on the light-emitting elements, wherein
the upper surface and a lower surface following the upper surface of the substrate has a curved shape in a front-rear direction of the vehicle, such that a curvature direction, of the substrate, varies along the front-rear direction, and the front-rear direction coincides with a front-rear axis of the vehicle, the outer lens layer has a continuously curved shape following a curvature of the upper surface of the substrate, the light-emitting elements are arranged along the curvature direction of the substrate, either the engine room or the trunk room is provided in the space enclosed by the curved shape of the substrate.

18. The vehicle according to claim 17, at least a part of the light-emitting elements, the wiring pattern and the upper surface of the substrate is covered by a sealing resin layer, the outer lens layer is integrated with the light-emitting elements, the wiring pattern and the upper surface of the substrate via the sealing resin layer in close contact without a gap.

19. The vehicle according to claim 17, the outer lens layer is in direct contact with the wiring pattern, the light-emitting elements, and the upper surface of the substrate.

\* \* \* \* \*